United States Patent
Park et al.

(10) Patent No.: US 10,283,528 B2
(45) Date of Patent: May 7, 2019

(54) THIN FILM TRANSISTOR ARRAY PANEL, LIQUID CRYSTAL DISPLAY INCLUDING THE SAME, AND MANUFACTURING METHOD THEREOF

(71) Applicant: Samsung Display Co., Ltd., Yongin-si (KR)

(72) Inventors: Jun Hyun Park, Suwon-si (KR); Do-Hyun Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/881,923

(22) Filed: Oct. 13, 2015

(65) Prior Publication Data

US 2016/0300860 A1    Oct. 13, 2016

(30) Foreign Application Priority Data

Apr. 10, 2015    (KR) .................. 10-2015-0051077

(51) Int. Cl.
 *H01L 27/12* (2006.01)
 *H01L 21/77* (2017.01)
 (Continued)

(52) U.S. Cl.
 CPC ...... *H01L 27/1225* (2013.01); *H01L 27/1244* (2013.01); *H01L 27/1248* (2013.01); *B32B 2457/202* (2013.01); *C08G 77/16* (2013.01); *G02F 1/133345* (2013.01); *G02F 2001/136263* (2013.01); *G02F 2001/136295* (2013.01); *H01L 2021/775* (2013.01); *Y10T 428/10* (2015.01)

(58) Field of Classification Search
 CPC combination set(s) only.
 See application file for complete search history.

(56) References Cited

U.S. PATENT DOCUMENTS 7,999,258 B2    8/2011    Lee et al.
8,218,117 B2 *  7/2012    Kim .................. G02F 1/134363
                                                349/141
(Continued)

FOREIGN PATENT DOCUMENTS

KR    1020090075804    7/2009
KR    1020130021607    3/2013
(Continued)

*Primary Examiner* — Anthony J Frost
(74) *Attorney, Agent, or Firm* — H.C. Park & Associates, PLC

(57) ABSTRACT

A thin film transistor array panel, including: a first insulating substrate; a gate line disposed on the first insulating substrate and including a gate electrode; a semiconductor layer disposed on the gate electrode; a data conductor layer disposed on the semiconductor layer, and including a data line crossing the gate line, a source electrode connected to the data line and exposing at least a part of the semiconductor layer, and a drain electrode facing the source electrode; a capping layer disposed on the data conductor layer, the semiconductor layer exposed between the source electrode and the drain electrode, and the entire surface of the first insulating substrate; and a first passivation layer disposed on the capping layer. The capping layer and the semiconductor layer include the same material.

10 Claims, 26 Drawing Sheets

(51) Int. Cl.
  *C08G 77/16* (2006.01)
  *G02F 1/1333* (2006.01)
  *G02F 1/1362* (2006.01)

(56) References Cited

U.S. PATENT DOCUMENTS

| | | | |
|---|---|---|---|
| 8,999,812 | B2 | 4/2015 | Xianyu et al. |
| 9,099,438 | B2 | 8/2015 | Park et al. |
| 2009/0242889 | A1 | 10/2009 | Nakayama |
| 2011/0127524 | A1* | 6/2011 | Yamazaki ............ H01L 27/1225 257/43 |
| 2012/0119211 | A1* | 5/2012 | Lin .................... H01L 29/78606 257/57 |
| 2013/0005081 | A1 | 1/2013 | Chen et al. |
| 2013/0048994 | A1* | 2/2013 | Choi ..................... H01L 29/458 257/59 |
| 2013/0056724 | A1* | 3/2013 | Chae .................. H01L 27/1225 257/43 |
| 2013/0299817 | A1* | 11/2013 | Park ........................ H01L 29/45 257/43 |
| 2014/0104676 | A1* | 4/2014 | Suh ........................ G02F 1/167 359/296 |

FOREIGN PATENT DOCUMENTS

| | | |
|---|---|---|
| KR | 1020130073712 | 7/2013 |
| KR | 101308534 | 9/2013 |
| KR | 1020130126240 | 11/2013 |

\* cited by examiner

THIN FILM TRANSISTOR ARRAY PANEL, LIQUID CRYSTAL DISPLAY INCLUDING THE SAME, AND MANUFACTURING METHOD THEREOF

CROSS-REFERENCE TO RELATED APPLICATION

This application claims priority from and the benefit of Korean Patent Application No. 10-2015-0051077 filed on Apr. 10, 2015, which is hereby incorporated by reference for all purposes as if fully set forth herein.

BACKGROUND

Field

Exemplary embodiments relate to a thin film transistor array panel, a liquid crystal display including the same, and a manufacturing method thereof.

Discussion of the Background

In general, a flat panel display, such as a liquid crystal display or an organic light emitting display, includes a plurality of pairs of field generating electrodes and an electro-optical active layer interposed therebetween. In the case of the liquid crystal display, a liquid crystal layer is included as the electro-optical active layer, and in the case of the organic light emitting display, an organic emission layer is included as the electro-optical active layer.

One pair of the field generating electrodes is generally connected to a switching element and receives an electric signal, and the electro-optical active layer displays an image by converting the electric signal to an optical signal.

A thin film transistor (TFT) that is a three terminal element is used as a switching element, and signal lines, such as a gate line transmitting a scanning signal for controlling the thin film transistor and a data line transmitting a signal to be applied to the pixel electrode, are provided in the flat panel display.

As the area of the display device is increased, oxide semiconductor technology has been continuously analyzed in order to implement high-speed driving, and a method of reducing resistance of the signal line has been studied. Particularly, in order to decrease electrical resistance of the signal line, a main wire layer may be formed of a material, such as copper or a copper alloy, and in this case, there is a problem in that the material, such as copper, may be diffused to a semiconductor layer formed of an oxide semiconductor, thereby reducing the reliability of the device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor array panel, which is capable of preventing a main wire layer from being oxidized by forming a capping layer interposed between the main wire layer and a passivation layer, a liquid crystal display including the same, and a manufacturing method thereof.

Additional aspects will be set forth in the detailed description which follows, and, in part, will be apparent from the disclosure, or may be learned by practice of the inventive concept.

An exemplary embodiment of the present invention discloses a thin film transistor array panel, including: a gate line disposed on a first insulating substrate, the gate line including a gate electrode; a semiconductor layer disposed on the gate electrode; a data conductor layer disposed on the semiconductor layer, the data conductor layer including a data line crossing the gate line, a source electrode connected to the data line and exposing at least a part of the semiconductor layer, and a drain electrode facing the source electrode; a capping layer disposed on the data conductor layer, the semiconductor layer exposed between the source electrode and the drain electrode, and the entire surface of the first insulating substrate; and a first passivation layer disposed on the capping layer, in which the capping layer and the semiconductor layer comprise the same material.

An exemplary embodiment of the present invention also discloses a thin film transistor array panel, including: a gate line disposed on a first insulating substrate, the gate line including a gate electrode; a semiconductor layer disposed on the gate electrode; a data conductor layer disposed on the semiconductor layer, and including a data line crossing the gate line, a source electrode connected to the data line and exposing at least a part of the semiconductor layer, and a drain electrode facing the source electrode; a capping layer disposed on the data conductor layer, the semiconductor layer exposed between the source electrode and the drain electrode, and the entire surface of the first insulating substrate; and a first passivation layer disposed on the capping layer, in which the capping layer includes an organic siloxane resin expressed by Chemical Formula 1 below.

[Chemical Formula 1]

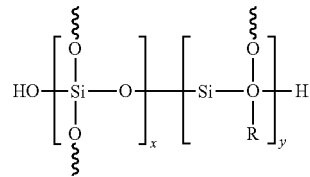

where R may be one or more substituents selected from saturated hydro carbon or unsaturated hydro carbon having 1 to 25 carbons, and may comprise one of a methyl group, a vinyl group, and a phenyl group, and each of x and y may be in a range of 1 to 200.

An exemplary embodiment of the present invention also discloses a liquid crystal display, including: a first insulating substrate; a second insulating substrate facing the first insulating substrate; a gate line disposed on the first insulating substrate and including a gate electrode and a gate pad part; a semiconductor layer disposed on the gate electrode; a data conductor layer disposed on the semiconductor layer, and including a data line crossing the gate line, a source electrode connected to the data line and exposing at least a part of the semiconductor layer, a drain electrode facing the source electrode, and a data pad part; a capping layer disposed on the data conductor layer, the semiconductor layer exposed between the source electrode and the drain electrode, and the entire surface of the first insulating substrate; a first passivation layer and a second passivation layer formed on the capping layer; a pixel electrode and a common electrode disposed on the second passivation layer, and overlapping with a third passivation layer interposed therebetween; a light blocking member and a color filter disposed on the second insulating substrate; and a liquid crystal layer interposed between the first insulating substrate and the second insulating substrate. The capping layer includes the same material as that of the semiconductor layer.

An exemplary embodiment of the present invention also discloses a liquid crystal display, including: a first insulating substrate; a second insulating substrate facing the first insulating substrate; a gate line disposed on the first insulating substrate and including a gate electrode and a gate pad part; a semiconductor layer disposed on the gate electrode; a data conductor layer disposed on the semiconductor layer, and including a data line crossing the gate line, a source electrode connected to the data line and exposing at least a part of the semiconductor layer, a drain electrode facing the source electrode, and a data pad part; a capping layer disposed on the data conductor layer, the semiconductor layer exposed between the source electrode and the drain electrode, and the entire surface of the first insulating substrate; a first passivation layer and a second passivation layer disposed on the capping layer; a pixel electrode and a common electrode disposed on the second passivation layer, and overlapping with a third passivation layer interposed therebetween; a light blocking member and a color filter disposed on the second insulating substrate; and a liquid crystal layer interposed between the first insulating substrate and the second insulating substrate. The capping layer includes an organic siloxane resin.

An exemplary embodiment of the present invention also discloses a method of manufacturing a thin film transistor array panel, including: forming a gate line including a gate electrode on a first insulating substrate; forming a gate insulating layer on the gate line; forming a semiconductor layer on the gate insulating layer; forming a data conductor layer including a source electrode and a drain electrode on the semiconductor layer; forming a capping layer including the same material as that of the semiconductor layer on an entire surface of the first insulating substrate including the data conductor layer under an oxygen partial pressure atmosphere of 0.15 to 0.3 Pa; plasma-treating a surface of the capping layer; and forming a first passivation layer on the capping layer.

An exemplary embodiment of the present invention also discloses a method of manufacturing a thin film transistor array panel, including: forming a gate line including a gate electrode on a first insulating substrate; forming a gate insulating layer on the gate line; forming a semiconductor layer on the gate insulating layer; forming a data conductor layer including a source electrode and a drain electrode on the semiconductor layer; forming a capping layer including an organic siloxane resin below on an entire surface of the first insulating substrate including the data conductor layer; plasma-treating a surface of the capping layer; and forming a first passivation layer on the capping layer The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
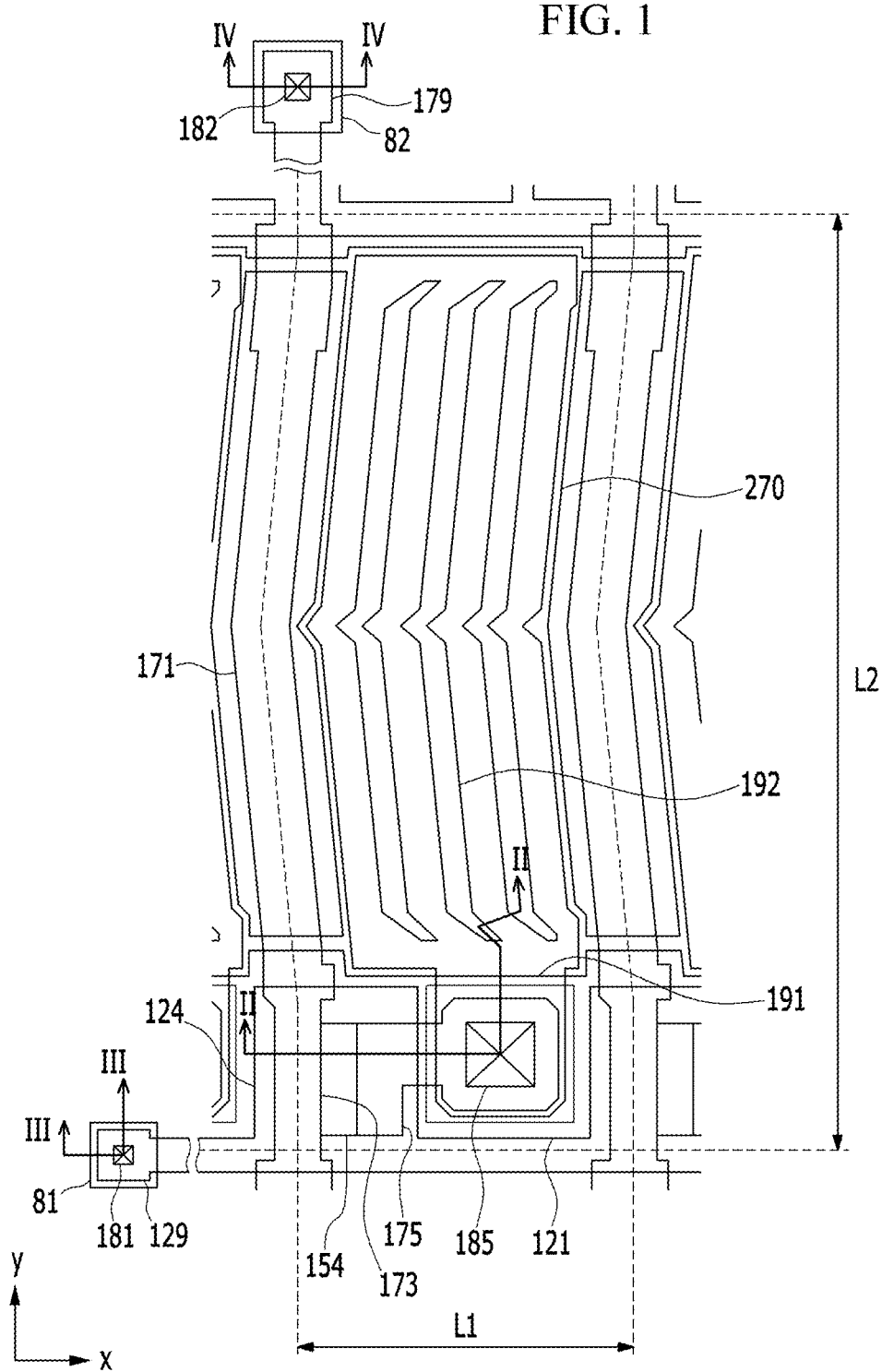
FIG. 1 is a layout view of a thin film transistor array panel according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, a thin film transistor array panel according to an exemplary embodiment of the present invention will be described in detail with reference to the accompanying drawings.

First, a liquid crystal display according to an exemplary embodiment of the present invention will be described in detail with reference to FIGS. 1 to 4.

Figure 2:
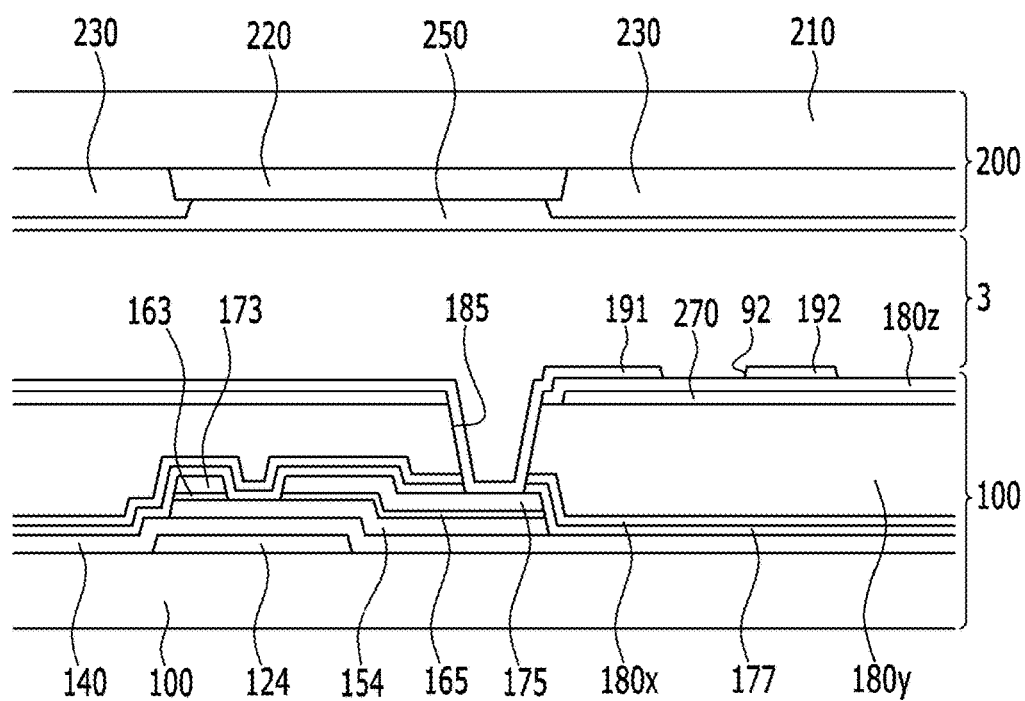
FIG. 2 is a cross-sectional view taken along line II-II of FIG. 1.
Figure 3:
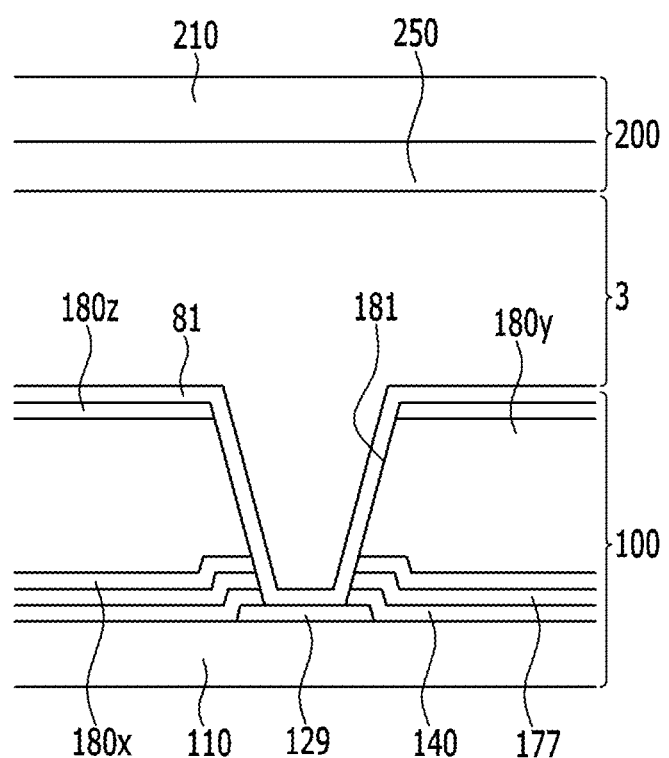
FIG. 3 is a cross-sectional view taken along line III-III of FIG. 1.
Figure 4:
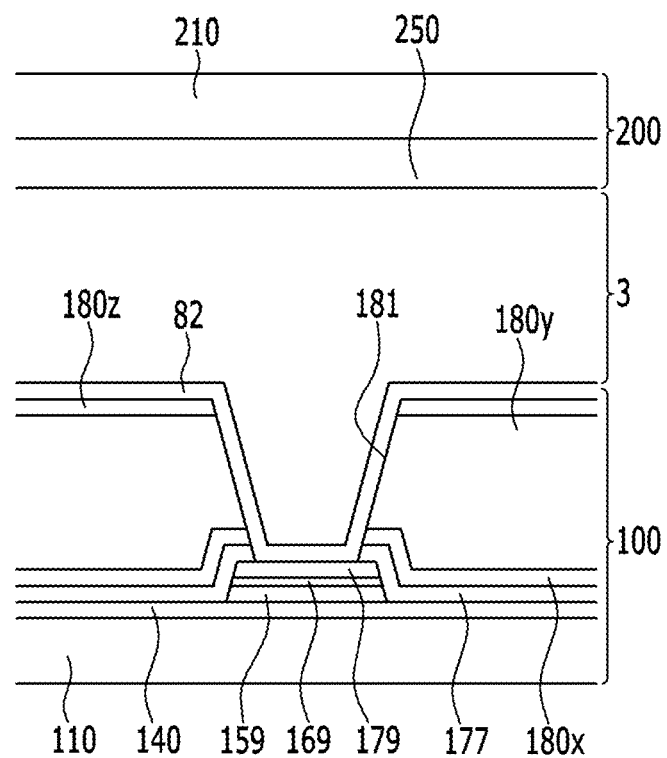
FIG. 4 is a cross-sectional view taken along line IV-IV of FIG. 1.

FIG. 1 is a layout view of a thin film transistor array panel according to an exemplary embodiment of the present invention. FIG. 2 is a cross-sectional view taken along line II-II of FIG. 1. FIG. 3 is a cross-sectional view taken along line III-III of FIG. 1. FIG. 4 is a cross-sectional view taken along line IV-IV of FIG. 1.

First, referring to FIGS. 1 to 4, a display according to an exemplary embodiment of the present invention includes a thin film transistor array panel or a lower panel 100 and an upper panel 200, which face each other, and a liquid crystal layer 3 interposed therebetween.

First, the thin film transistor array panel 100 will be described.

A gate conductor including a gate line 121 is formed on a first insulating substrate 110 formed of transparent glass, plastics or the like.

The gate line 121 includes a gate electrode 124, and a gate pad part 129 for a connection with another layer or an external driving circuit. The gate line 121 may be made of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and titanium (Ti). However, the gate line 121 may also have a multilayered structure including two or more conductive layers having different physical properties.

A gate insulating layer 140 formed of silicon nitride ($SiN_x$), silicon oxide ($SiO_x$), or the like is formed on the gate conductors 121, 124, and 129. The gate insulating layer 140 may also have a multilayered structure including at least two insulating layers having different physical properties.

A semiconductor 154 made of amorphous silicon, polysilicon, or the like is formed on the gate insulating layer 140. The semiconductor 154 may include an oxide semiconductor, and the semiconductor 154 may include at least one of zinc (Zn), indium (In), tin (Sn), gallium (Ga), and hafnium (Hf), and the semiconductor 154 may be an indium-gallium-zinc oxide.

The semiconductor 154 may be formed with a thickness of 300 to 600 Å.

Ohmic contacts 163 and 165 may be formed on the semiconductor 154. The ohmic contacts 163 and 165 may made of a material, such as n+ hydrogenated amorphous silicon doped with an n-type impurity, such as phosphorus, at a high concentration, or silicide. The ohmic contacts 163 and 165 may be paired up and disposed on the semiconductor 154. When the semiconductor 154 is the oxide semiconductor, the ohmic contacts 163 and 165 may be omitted.

A data conductor including a data line 171 including a source electrode 173 and a drain electrode 175 is formed on the ohmic contacts 163 and 165 and the gate insulating layer 140.

The data line 171 includes a data pad part 179 for a connection with another layer or an external driving circuit. The data line 171 transmits a data signal and extends mainly in a vertical direction to cross the gate line 121.

In this case, the data line 171 may have a first bent portion having a bent shape in order to obtain maximum transmittance of the liquid crystal display, and the bent portions may meet each other in a center area of a pixel area to form a V shape. A second bent portion that is bent so as to form a predetermined angle with the first bent portion may be further included in the center area of the pixel area.

The first bent portion of the data line 171 may be bent at an angle of about 7° with respect to a vertical reference line y (reference line extending in a y direction) forming a 90° angle with respect to an extension direction (x direction) of the gate line 121. The second bent portion disposed in the center area of the pixel area may be further bent so as to form an angle of about 7° to about 15° with respect to the first bent portion.

The source electrode 173 is a portion of the data line 171, and disposed on the same line as the data line 171. The drain electrode 175 is formed so as to extend in parallel to the source electrode 173. Accordingly, the drain electrode 175 is parallel to a portion of the data line 171.

The drain electrode 175 includes a rod-shaped end portion facing the source electrode 173 based on the gate electrode 124 and the other end portion having a large area.

A first semiconductor 159 and a first assistant ohmic contact 169 may be disposed under the data pad part 179, but may be omitted in some exemplary embodiments.

The data conductors 171, 173, and 175, including the data line 171, the source electrode 173, and the drain electrode 175, form a main wire layer. The gate electrode 124, the source electrode 173, and the drain electrode 175 form one thin film transistor TFT together with the semiconductor 154. A channel of the thin film transistor is formed in the semiconductor 154 between the source electrode 173 and the drain electrode 175.

The thin film transistor array panel according to an exemplary embodiment of the present invention includes the source electrode 173 positioned on the same line as the data line 171 and the drain electrode 175 extending in parallel to the data line 171. Such an arrangement makes it possible to increase a width of the thin film transistor without increasing the area of the data conductors, thereby increasing an aperture ratio of the liquid crystal display.

However, a thin film transistor array panel according to another exemplary embodiment of the present invention may have a source electrode 173 and a drain electrode 175 having different forms.

The data line 171 and the drain electrode 175 according to an exemplary embodiment of the present invention may be formed of copper (Cu) or a copper alloy, but may instead be formed of refractory metal, such as molybdenum, chrome, tantalum, and titanium, or an alloy thereof. Further, the data line 171 and the drain electrode 175 may have a multilayered structure including a refractory metal layer (not illustrated) and a low-resistant conductive layer (not illustrated). Examples of the multilayered structure may include a double layer of a chromium or molybdenum (alloy) lower layer and an aluminum (alloy) upper layer, and a triple layer of a molybdenum (alloy) lower layer, an aluminum (alloy) middle layer, and a molybdenum (alloy) upper layer. However, the data line 171 and the drain electrode 175 may be made of various other metals or conductors in addition to the ones listed.

A capping layer 177 is formed on the main wire layer including the data conductor 171, 173, and 175 of the thin film transistor array panel according to an exemplary embodiment of the present invention, and the entire surface of the remaining first insulating substrate 110 in which the data conductor 171, 173, and 175 are not formed.

That is, the capping layer 177 is formed on the data conductors 171, 173, and 175. The capping layer 177 is formed of the same material as that of the semiconductor 154, but is not limited thereto, and the semiconductor material may include one or more selected from amorphous silicon, an oxide semiconductor, and a low temperature polysilicon (LTPS).

That is, the capping layer 177 may include at least one of zinc (Zn), indium (In), tin (Sn), gallium (Ga), and hafnium (Hf), identically to the semiconductor 154, and may be an indium-gallium-zinc oxide.

The capping layer 177 according to the exemplary embodiment of the present invention covers the source electrode 173 and the drain electrode 175 while being in direct contact with the surfaces of the source electrode 173 and the drain electrode 175 and, more particularly, covers the exposed lateral parts of the source electrode 173 and the drain electrode 175.

Referring to FIGS. 3 and 4, the capping layer 177 is formed on the entire surface of the first insulating substrate 110, so that the capping layer 177 may be formed on the surfaces of the gate insulating layer 140 of the gate pad part 129 and the data pad part 179.

Further, in contrast to this, the capping layer 177 according to an exemplary embodiment of the present invention may be formed of a resin that may be deposited at a low temperature, and in this case, the capping layer 177 may include an organic siloxane resin expressed by Chemical Formula 1 below.

[Chemical Formula 1]

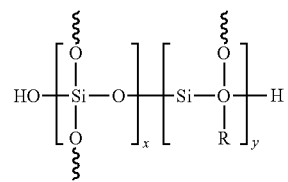

where R is one or more substituents selected from saturated hydro carbon or unsaturated hydro carbon having 1 to 25 carbons, and each of x and y is in a range of 1 to 200, and R may include one of a methyl group, a vinyl group, and a phenyl group.

Chemical formula 1 is formed by polymerization by a hydrolysis reaction of a compound expressed by chemical formula 2 and chemical formula 3. Chemical formula 2 may have a structure in which methylsiloxane, vinylsiloxane, and tetrahydroxysiloxane randomly exists with a predetermined ratio, and chemical formula 3 may have a structure in which phenylsiloxane, vinylsiloxane, and tetrahydroxysiloxane randomly exists with a predetermined ratio.

[Chemical Formula 2]

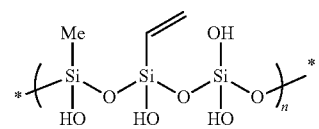

[Chemical Formula 3]

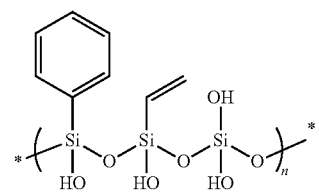

In general, an oxide semiconductor is used as the semiconductor 154, and when copper and the like is used as a low resistance wire, a passivation layer formed of a silicon oxide or a nitride oxide is deposited on the wire at a high temperature (about 370° C.), and a problem may occur in that a wire surface is oxidized and a characteristic of the thin film transistor is not implemented due to a process, such as an $N_2O$ plasma treatment.

Accordingly, in the thin film transistor array panel according to an exemplary embodiment, the capping layer 177 formed of the same material as that of the semiconductor 154 or the resin expressed by chemical formula 1 that may be deposited by a low temperature process on the lateral surfaces of the data conductors 171, 173, and 175, as well as the upper surfaces of the data conductors 171, 173, and 175, thereby preventing the data conductors 171, 173, and 175 from being oxidized.

The capping layer 177 may be formed with a smaller thickness, that is, 100 to 500 Å, than that of the semiconductor 154, but is not limited thereto.

The reason is that when the capping layer 177 is formed with a thickness less than 100 Å, it may become difficult for the capping layer 177 to exhibit an effect of an oxidization prevention of the data conductors 171, 173, and 175, and when the capping layer 177 is formed with a thickness greater than 500 Å, a deposition process time may be excessively increased.

A first passivation layer 180x is disposed on exposed portions of the data conductors 171, 173, 175, and 179, the gate insulating layer 140, and the semiconductor 154. The first passivation layer 180x may be formed of an organic insulating material or an inorganic insulating material, such as a silicon nitride and a silicon oxide.

Further, the first passivation layer 180x includes a plurality of first openings, and the first openings may expose a part of the drain electrode 175, or be formed at positions at which the gate pad part 129 and the data pad part 179 are exposed.

Further, the first openings may be formed at positions corresponding to contact holes 181, 182, and 185 included in a second passivation layer 180y, or at the same positions as those of the contact holes 181, 182, and 185.

The second passivation layer 180y is disposed on the first passivation layer 180x. The second passivation layer 180y may be thicker than the first passivation layer 180x, and have a flat surface. Here, the second passivation layer 180y may be a color filter. When the second passivation layer 180y is a color filter, the second passivation layer 180y may intrinsically display one of the primary colors, and examples of the primary colors may include three primary colors, such as red, green, or blue, yellow, cyan, magenta, or the like. Although not illustrated in the drawings, the color filter may further include a color filter displaying a mixed color of the primary colors or white in addition to the primary colors.

A first thickness of the second passivation layer 180y positioned in a display area, in which a plurality of pixels is positioned to display an image, may be greater than a second thickness of the second passivation layer 180y positioned in a peripheral area, in which the gate pad part 129 or the data pad part 179 is formed.

The second passivation layer 180y may be positioned in the display area, in which the plurality of pixels is positioned, and not in the peripheral area, in which the gate pad part 129 or the data pad part 179 is formed.

In the thin film transistor array panel according to another exemplary embodiment of the present invention, the second passivation layer 180y may be omitted.

The second passivation layer 180y is removed in the areas corresponding to the drain electrode 175, the gate pad part 129, and the data pad part 179.

The second passivation layer 180y is removed, and the first contact hole 181 exposing the gate pad part 129 is formed in the first passivation layer 180x, the capping layer 177, and the gate insulating layer 140 positioned in an area corresponding to the gate pad part 129.

The second passivation layer 180y is removed, and the second contact hole 182 exposing the data pad part 179 is formed in the first passivation layer 180x and the capping layer 177 positioned in an area corresponding to the data pad part 179.

The second passivation layer 180y, the first passivation layer 180x, and the capping layer 177 positioned in the area corresponding to the drain electrode 175 have the third contact hole 185.

That is, as described above, the contact hole included in the second passivation layer 180y may correspond to the first opening included in the first passivation layer 180x.

A common electrode 270 is formed on the second passivation layer 180y. The common electrode 270 may have a surface shape and be formed on the entire surface of the substrate 110 in a plate shape, and may have an opening (not illustrated) disposed in an area corresponding to the peripheral area of the drain electrode 175. That is, the common electrode 270 may have a plate planar shape.

The common electrodes 270 positioned at the adjacent pixels may be connected to each other to receive a common voltage having a predetermined size supplied from the outside of the display area.

Next, a third passivation layer 180z is positioned on the common electrode 270 and the second passivation layer 180y. The third passivation layer 180z may be formed of an organic insulating material, an inorganic insulating material, or the like.

The third passivation layer 180z may include a plurality of second openings. Any one of the plurality of second openings exposes the drain electrode 175, some of the plurality of second openings are formed on the second passivation layer 180y, and others of the plurality of second openings are positioned so as to expose the gate pad part 129 or the data pad part 179.

The predetermined second opening exposing the drain electrode 175 corresponds to the third contact hole 185, the predetermined second opening exposing the gate pad part 129 corresponds to the first contact hole 181, and the second opening exposing the data pad part 179 corresponds to the second contact hole 182.

A pixel electrode 191 is formed on the third passivation layer 180z. The pixel electrode 191 includes a curved edge that is almost parallel to the first bent portion and the second bent portion of the data line 171. The pixel electrode 191 includes a plurality of cutouts, and a plurality of branch electrodes 192 defined by the plurality of cutouts.

The third contact hole 185 exposing the drain electrode 175 is formed in the first passivation layer 180x, the second passivation layer 180y, and the third passivation layer 180z, and the pixel electrode 191 is physically and electrically connected with the drain electrode 175 through the third contact hole 185 to receive a voltage from the drain electrode 175.

Further, a first assistant contact member 81 is positioned on the gate pad part 129 exposed through the first contact hole 181 and the predetermined first opening corresponding to the first contact hole 181, and a second assistant contact member 82 is positioned on the data pad part 179 exposed through the second contact hole 182 and the predetermined first opening corresponding to the second contact hole 182.

In this case, the pixel electrode 191, the first assistant contact member 81, and the second assistant contact member 82 may be formed on the same layer at the same time.

Although not illustrated in the drawings, an alignment layer (not illustrated) may be formed on the pixel electrode 191 and the third passivation layer 180*z*, may be a horizontal alignment layer, and may be rubbed in a predetermined direction. However, in the liquid crystal display according to another exemplary embodiment of the present invention, the alignment layer may include an optical reaction material to be optically aligned.

The upper panel 200 will now be described.

A light blocking member 220 is formed on a second insulating substrate 210 made of transparent glass, plastic or the like. The light blocking member 220 is also called a black matrix and prevents light leakage.

A plurality of color filters 230 may be formed on the second insulating substrate 210. When the second passivation layer 180*y* of the lower panel 100 is a color filter, the color filter 230 of the upper panel 200 may be omitted. Further, the light blocking member 220 of the upper panel 200 may also be formed on the lower panel 100.

An overcoat 250 may be formed on the color filter 230 and the light blocking member 220. The overcoat 250 may be formed of an (organic) insulating material, and prevents the color filter 230 from being exposed and provides a flat surface. The overcoat 250 may be omitted.

An alignment layer may be disposed on the overcoat 250.

The liquid crystal layer 3 includes a nematic liquid crystal material having positive dielectric anisotropy. Liquid crystal molecules of the liquid crystal layer 3 are arranged so that directions of long axes thereof are parallel to the panels 100 and 200, and the liquid crystal layer has a spiral structure twisted 90° from a rubbing direction of the alignment layer of the lower panel 100 to the upper panel 200.

The pixel electrode 191 receives a data voltage from the drain electrode 175, and the common electrode 270 receives a common voltage having a predetermined size from a common voltage applying part disposed outside the display area.

The pixel electrode 191 and the common electrode 270, which are field generating electrodes, generate an electric field, so that the liquid crystal molecules of the liquid crystal layer 3 positioned on the two electrodes 191 and 270 are rotated in a direction parallel to a direction of the electric field. Polarization of light passing through the liquid crystal layer is changed according to the determined direction of the rotation of the liquid crystal molecules.

A manufacturing process of thin film transistor array panel according to an exemplary embodiment of the present invention will now be described with reference to FIGS. 5 to 22.

FIGS. 5 to 21 are cross-sectional views sequentially illustrating a method of manufacturing the thin film transistor array panel according to the exemplary embodiment of the present invention.

FIGS. 5, 8, 11, 14, and 17 are cross-sectional views sequentially illustrating a method of manufacturing the thin film transistor array panel according to an exemplary embodiment of the present invention, and are taken along line II-II of FIG. 1. FIGS. 6, 9, 12, 15, 18, and 21 are cross-sectional views sequentially illustrating the method of manufacturing the thin film transistor array panel according to the exemplary embodiment of the present invention, and are taken along line III-III of FIG. 1. FIGS. 7, 10, 13, 16, 19, and 22 are cross-sectional views sequentially illustrating the method of manufacturing the thin film transistor array panel according to the exemplary embodiment of the present invention, and are taken along line IV-IV of FIG. 1.

Figure 5:
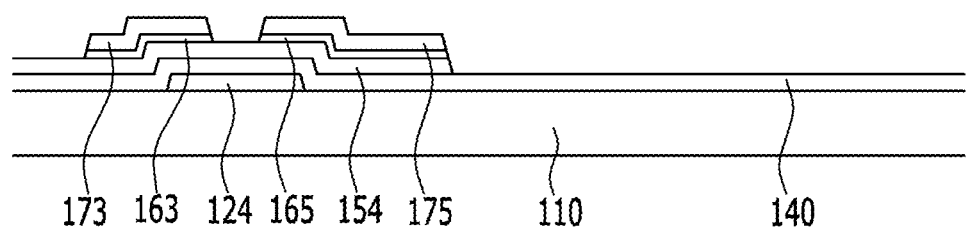
FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 are cross-sectional views sequentially illustrating a method of manufacturing the thin film transistor array panel according to an exemplary embodiment of the present invention.
Figure 6:
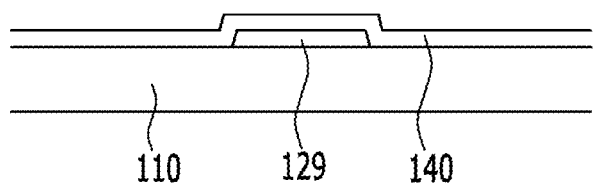
Figure 7:
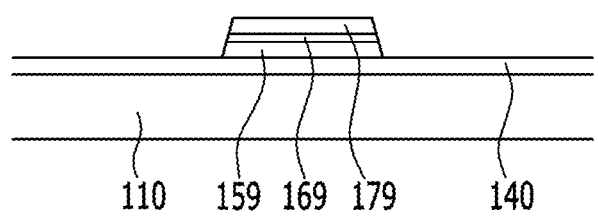

Referring to FIGS. 5 to 7, the gate conductors 121, 124, and 129 including the gate line 121, the gate electrode 124, and the gate pad part 129 are formed on the insulating substrate 110, and the gate insulating layer 140 is stacked on the gate conductors 121, 124, and 129. The semiconductor 154, the first semiconductor 159, the ohmic contacts 163 and 165, the first assistant ohmic contact 169, and the data conductors 171, 175, and 179 including the data line 171, the drain electrode 175, and the data pad part 179 are formed on the gate insulating layer 140. Here, the semiconductor 154 may be formed in an oxygen partial pressure of 0.15 to 0.3 pa.

The semiconductor 154 may be formed to have a thickness of 300 to 600 Å.

Figure 8:
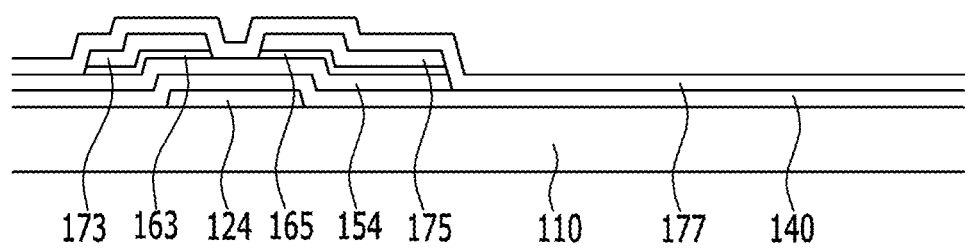
Figure 9:
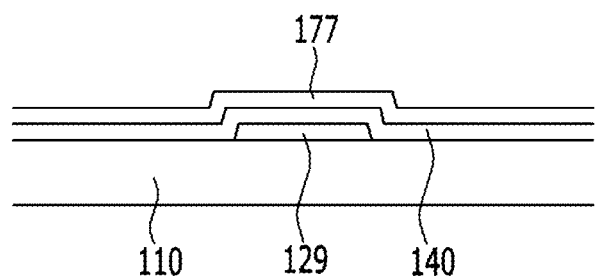
Figure 10:
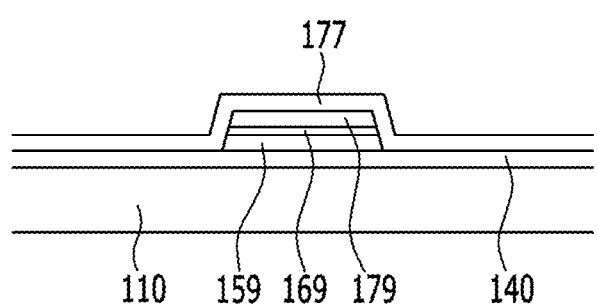

The capping layer 177 is formed on the gate insulating layer 140, the data conductors 171, 175, and 179, and the exposed semiconductor 154, as illustrated in FIGS. 8 to 10. That is, the capping layer 177 is formed on the entire surface of the insulating substrate 110.

The capping layer 177 may be formed of the same material as that of the semiconductor 154, but is not limited thereto, and may be formed of one or more of amorphous silicon, an oxide semiconductor, and LTPS selected as the semiconductor material.

That is, the capping layer 177 may include one or more of zinc (Zn), indium (In), tin (Sn), gallium (Ga), and hafnium (Hf), identically to the semiconductor 154, and may be an indium-gallium-zinc oxide.

Here, when the capping layer 177 is deposited, a deposition process may be performed at a low temperature in order to prevent the data conductors 171, 175, and 179 from being oxidized.

In order to prevent a short circuit caused by a contact between the capping layer 177 and the semiconductor 154, the capping layer 177 using the semiconductor material may be formed at a larger oxygen partial pressure than that when the semiconductor 154 is formed. Accordingly, when the capping layer 177 is formed, the capping layer 177 may be formed at an oxygen partial pressure of 0.3 to 1.0 pa. The reason is that when the capping layer 177 formed of the semiconductor material is formed under a high oxygen partial pressure atmosphere, electrical resistance is increased, so that it is possible to prevent a short circuit even though the capping layer 177 is in contact with the semiconductor 154.

More particularly, the capping layer 177 may be formed to have a relatively large electrical resistance by (1) a method of forming the capping layer 177 under an atmosphere in which a hydrogen flow rate is decreased when amorphous silicon is used as a material of the capping layer 177; (2) a method of forming the capping layer 177 under an atmosphere in which an oxygen partial pressure is increased when an oxide semiconductor is used as a material of the capping layer 177; (3) a method of forming the capping layer 177 is formed under an atmosphere in which a hydrogen flow rate is decreased when LTPS is used as a material of the capping layer 177, and the like.

The capping layer 177 according to an exemplary embodiment of the present invention is formed to cover the source electrode 173 and the drain electrode 175 while being in direct contact with the surfaces of the source electrode 173 and the drain electrode 175, and, particularly, is formed to cover even the exposed lateral parts of the source electrode 173 and the drain electrode 175.

The capping layer 177 according to the exemplary embodiment of the present invention is formed on the entire surface of the first insulating substrate 110, so that the capping layer 177 may be formed on even the surfaces of the gate insulating layer 140 of the gate pad part 129 and the data pad part 179.

In contrast to this, the capping layer 177 according to the exemplary embodiment of the present invention may be formed of a resin that may be deposited at a low temperature, and in this case, the capping layer 177 may include an organic siloxane resin expressed by Chemical Formula 1 below

[Chemical Formula 1]

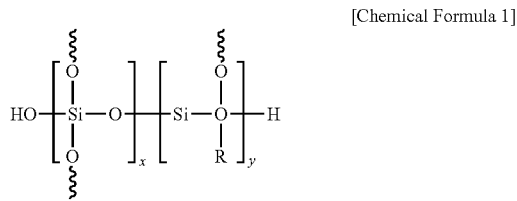

where R is one or more substituents selected from saturated hydro carbon or unsaturated hydro carbon having 1 to 25 carbons, and each of x and y is in a range of 1 to 200, and R may include one of a methyl group, a vinyl group, and a phenyl group.

Chemical formula 1 is formed by polymerization by a hydrolysis reaction of a compound expressed by chemical formula 2 and chemical formula 3. Chemical formula 2 may have a structure in which methylsiloxane, vinylsiloxane, and tetrahydroxysiloxane randomly exists with a predetermined ratio, and chemical formula 3 may have a structure in which phenylsiloxane, vinylsiloxane, and tetrahydroxysiloxane randomly exists with a predetermined ratio.

[Chemical Formula 2]

[Chemical Formula 3]

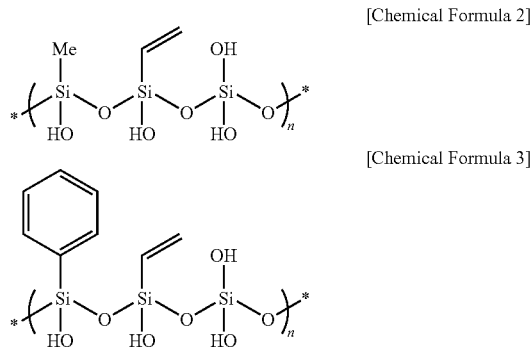

The capping layer 177 may be formed to have a smaller thickness, that is, 100 to 500 Å, than that of the semiconductor 154.

The reason for this is that when the capping layer 177 is formed with a thickness smaller than 100 Å, it may be difficult for the capping layer 177 to exhibit an effect of an oxidization prevention of the data conductors 171, 173, and 175, and when the capping layer 177 is formed with a thickness larger than 500 Å, a deposition process time may be excessively increased.

Figure 11:
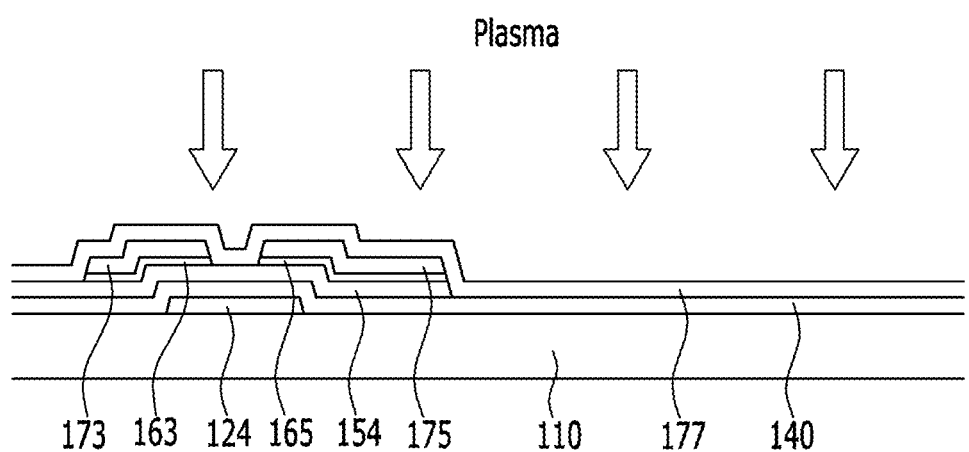
Figure 12:
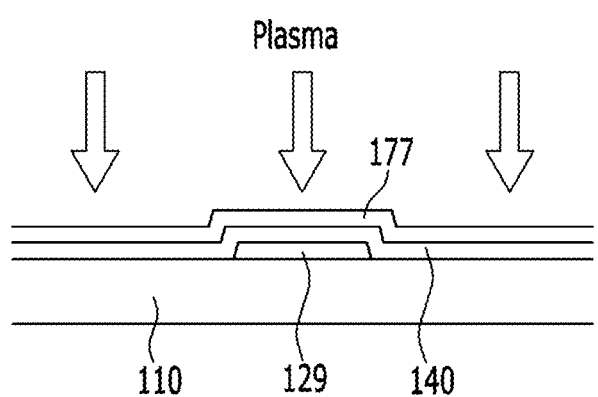
Figure 13:
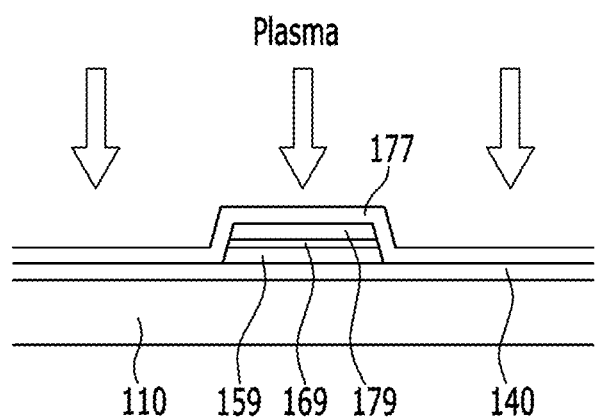

Next, referring to FIGS. 11 to 13, a surface of the capping layer 177 may be plasma-treated after the capping layer 177 is formed, and in this case, the surface of the capping layer 177 may be nitrous oxide ($N_2O$) plasma-treated, but is not limited thereto.

Figure 14:
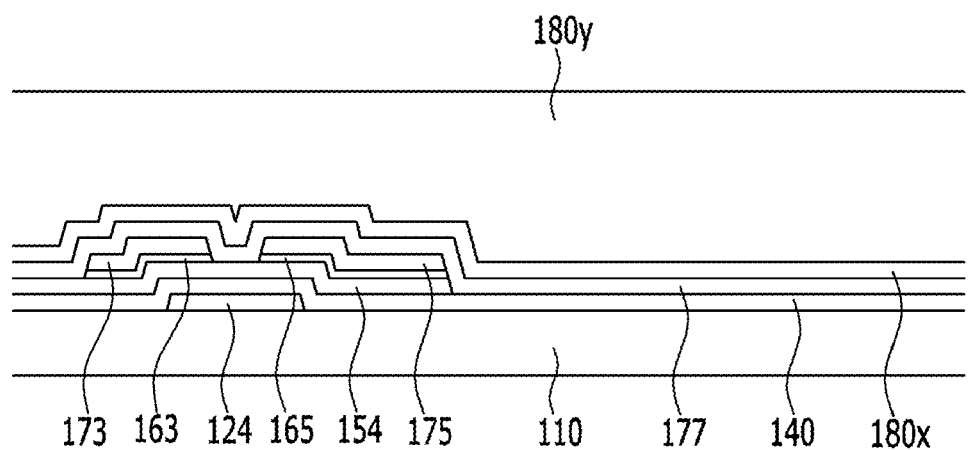
Figure 15:
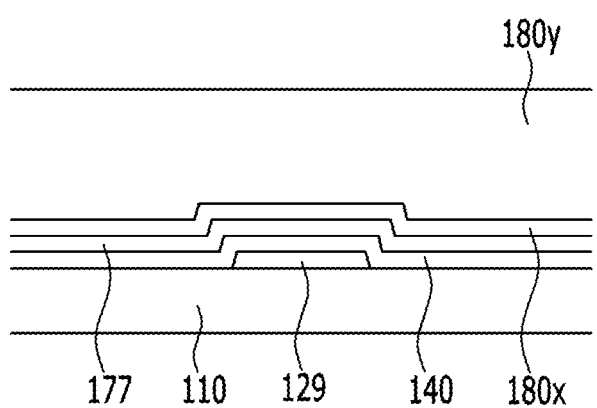
Figure 16:
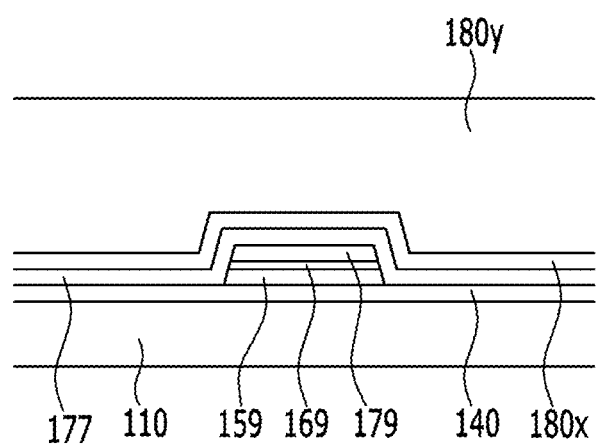

Next, as illustrated in FIGS. 14 to 16, the first passivation layer 180x and the second passivation layer 180y are stacked on the capping layer 177.

In general, an oxide semiconductor may be used as the semiconductor 154, and when copper and the like is used as a low resistance wire, the first passivation layer 180x formed of a silicon oxide or a nitride oxide is deposited on the wire at a high temperature (about 370° C.), and a problem may occur in that a copper wire surface is oxidized and a characteristic of the thin film transistor is not implemented due to a process, such as the $N_2O$ plasma treatment.

Accordingly, in the thin film transistor array panel according to an exemplary embodiment, the capping layer 177 formed of the same material as that of the semiconductor 154 or the resin expressed by chemical formula 1 that may be deposited by a low temperature process on the lateral surfaces of the data conductors 171, 173, and 175, as well as the upper surfaces of the data conductors 171, 173, and 175, thereby preventing the data conductors 171, 173, and 175 from being oxidized due to the plasma treatment and the deposition process of the first passivation layer 180x.

Figure 17:
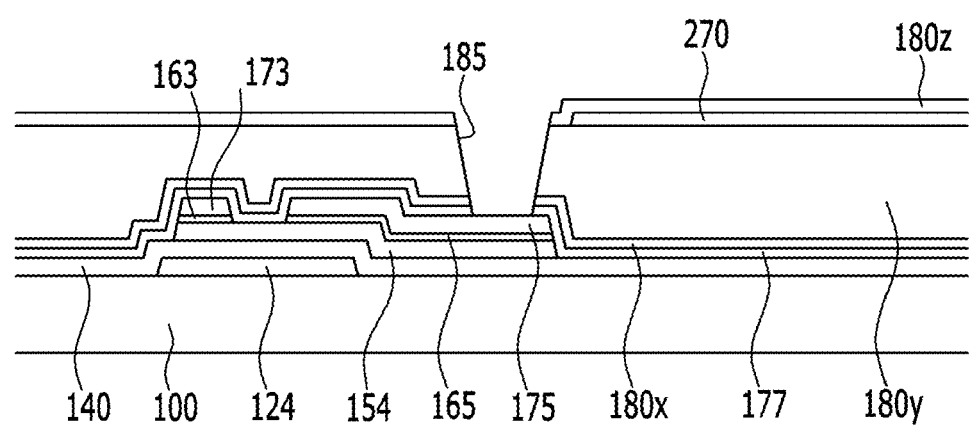
Figure 18:
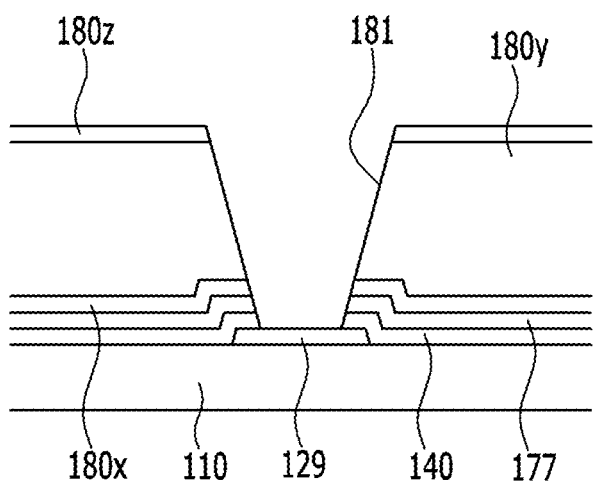
Figure 19:
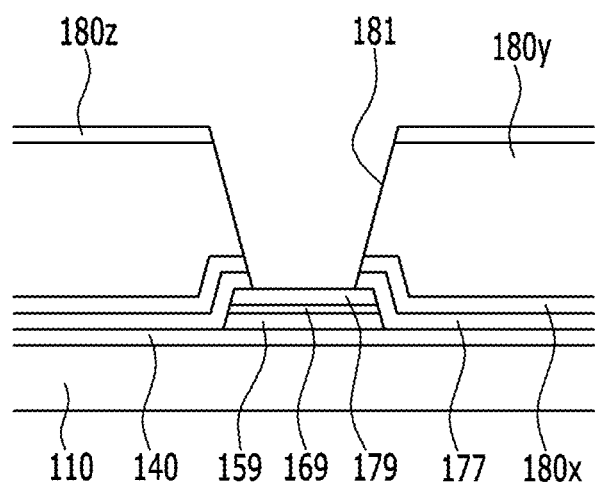

Next, the common electrode 270 and the third passivation layer 180z are formed on the second passivation layer 180y, as illustrated in FIGS. 17 to 19.

A photosensitive layer (not illustrated) is formed on the third passivation layer 180z, a photosensitive layer (not illustrated) pattern is formed through exposure and development, and the first to third passivation layers 180x, 180y, and 180z and the capping layer 177 are etched by using the photosensitive layer pattern as a mask. Accordingly, the first to third passivation layers 180x, 180y, and 180z may include the plurality of contact holes.

As illustrated in FIG. 17, the etched first to third passivation layers 180x, 180y, and 180z and the etched capping layer 177 expose a part of the drain electrode 175. Further, referring to FIG. 18, the first to third passivation layers 180x, 180y, and 180z, the gate insulating layer 140, and the capping layer 177 are etched by the etching, to expose the gate pad part 129. Further, as illustrated in FIG. 19, the data pad part 179 is exposed through the etching of the first to third passivation layers 180x, 180y, and 180z, and the capping layer 177.

Figure 20:
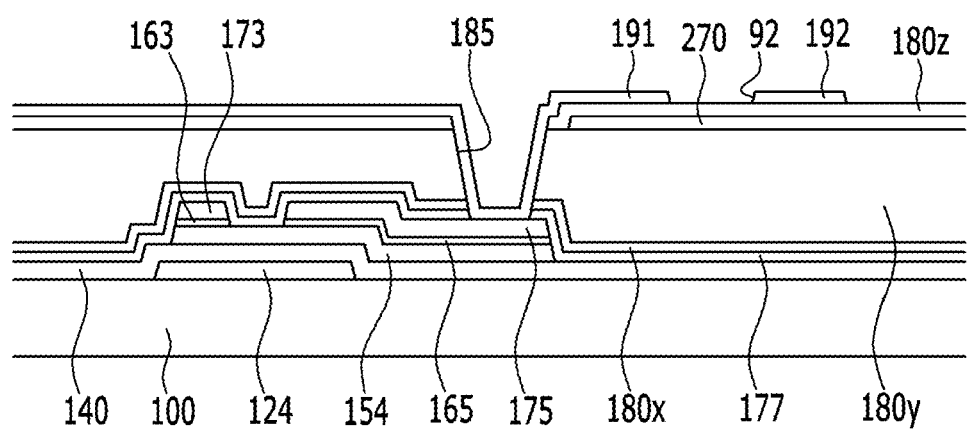

Next, as illustrated in FIG. 20, the pixel electrode 191 may be formed so as to be electrically connected with the drain electrode 175 through the third contact hole 185 on the third passivation layer 180z.

Figure 21:
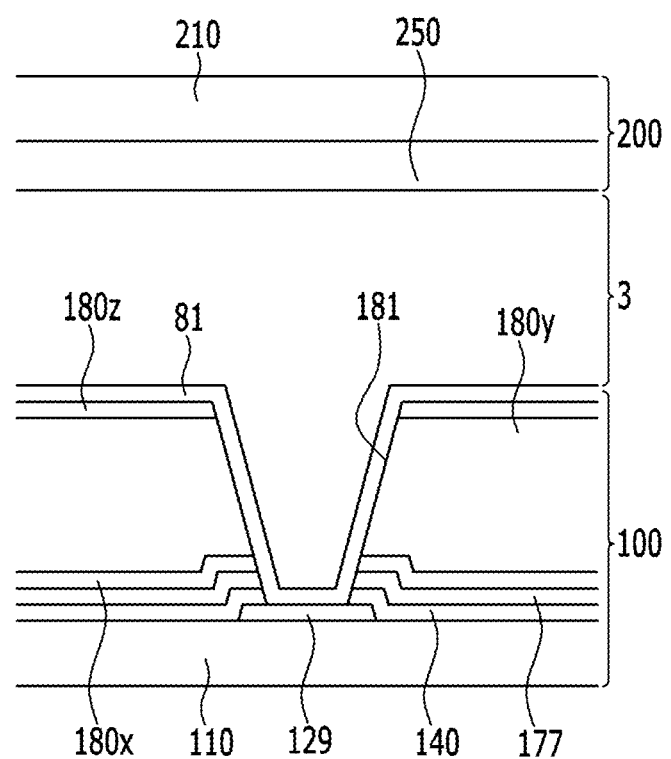
Figure 22:
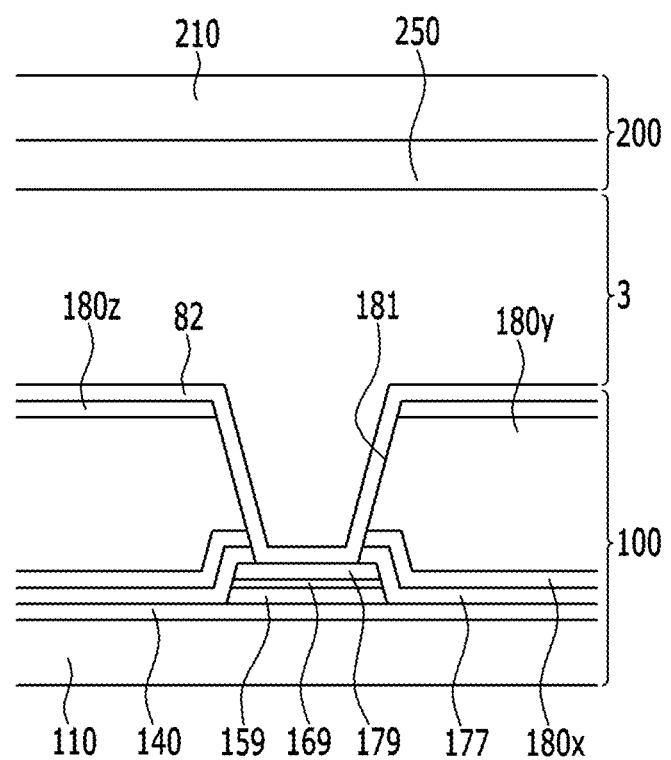

Further, as illustrated in FIGS. 21 and 22, the first assistant contact member 81 is positioned on the gate pad part 129 exposed through the first contact hole 181 and the predetermined first opening corresponding to the first contact hole 181, and the second assistant contact member 82 is positioned on the data pad part 179 exposed through the second contact hole 182 and the predetermined second opening corresponding to the second contact hole 182 to complete the thin film transistor array panel.

In this case, the pixel electrode 191, the first assistant contact assistant member 81, and the second assistant contact assistant member 82 may be formed on the same layer at the same time.

Then, a thin film transistor array panel according to another exemplary embodiment of the present invention will be described with reference to FIG. 23.

Figure 23:
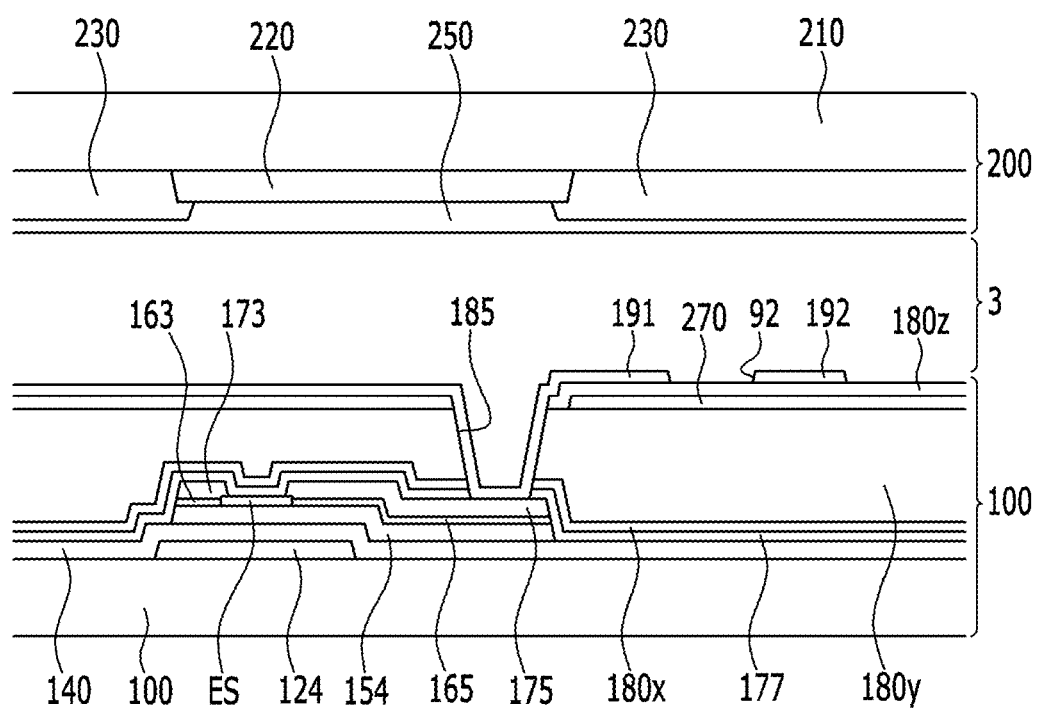
FIG. 23 is a cross-sectional view of a thin film transistor array panel according to another exemplary embodiment of the present invention.

FIG. 23 is a cross-sectional view of a thin film transistor array panel according to another exemplary embodiment of the present invention.

The thin film transistor array panel according to another exemplary embodiment of the present invention illustrated in FIG. 23 is the same as the exemplary embodiment of the present invention illustrated in FIGS. 1 and 2, except for an etch stopper ES, so that overlapping descriptions will be omitted.

The thin film transistor array panel according to another exemplary embodiment of the present invention may further include the etch stopper ES in order to prevent an semiconductor 154 exposed between a source electrode 173 and a drain electrode 175 from being excessively etched.

Hereinafter, a result of an experiment of electrical resistance according to a condition for forming the capping layer 177 of the thin film transistor array panel according to the exemplary embodiment of the present invention will be described with reference to FIG. 24.

Figure 24:
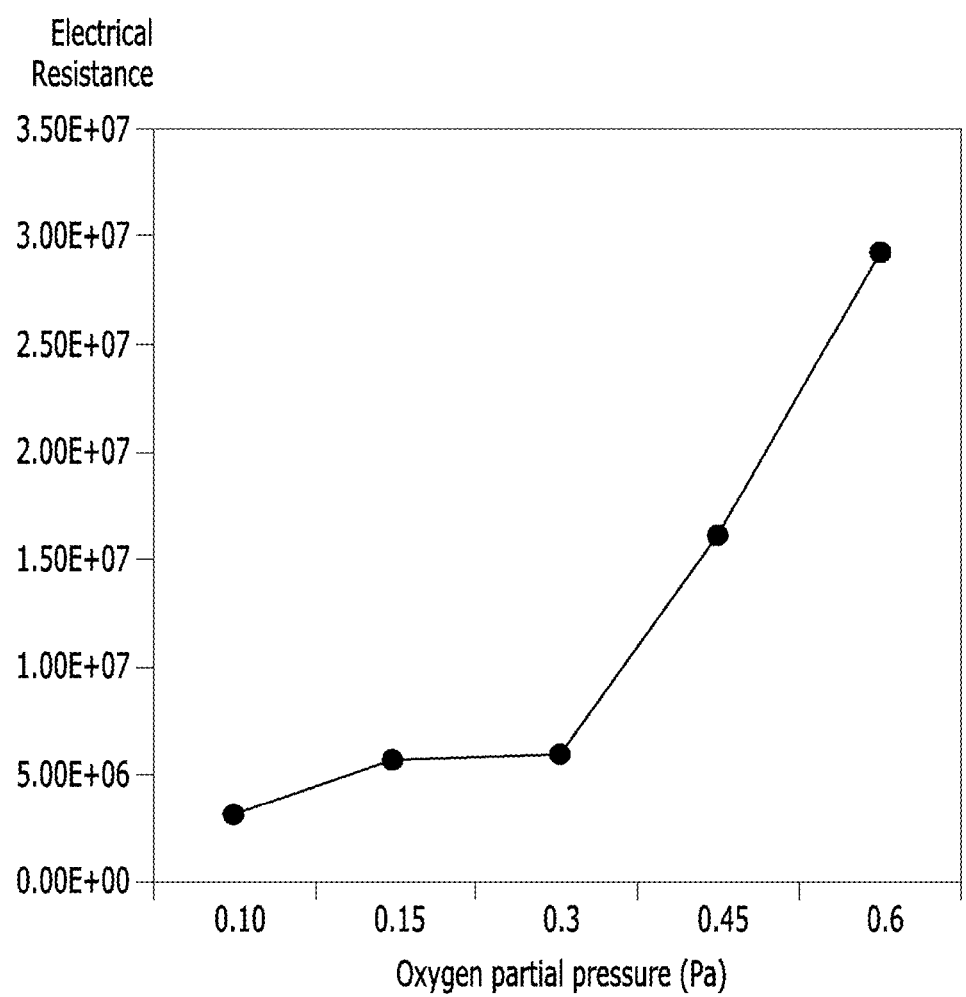
FIG. 24 is a graph of a measurement of resistance of a capping layer according to an oxygen partial pressure when the capping layer of the thin film transistor array panel according to an exemplary embodiment of the present invention is deposited.

FIG. 24 is a graph of a measurement of resistance of the capping layer according to an oxygen partial pressure when the capping layer of the thin film transistor array panel according to the exemplary embodiment of the present invention is deposited.

Referring to FIG. 24, it can be seen that when the capping layer is formed under an oxygen partial pressure atmosphere exceeding 0.3 Pa, the electrical resistance of the capping layer is sharply increased.

It can be seen that when the capping layer is formed under high oxygen partial pressure atmosphere, electrical resistance of the capping layer is increased, so that even though the capping layer is in direct contact with the semiconductor, it is possible to prevent the semiconductor and the capping layer from being short-circuited.

Figure 25A:
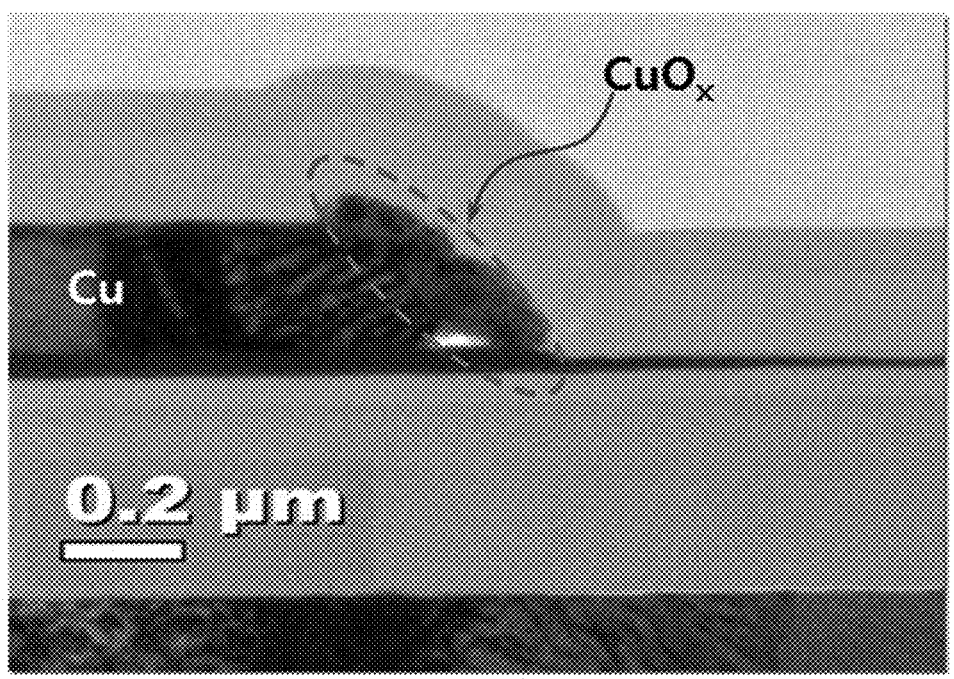
FIGS. 25A and 25B are pictures of main wire layers of the thin film transistor array panels according to a Comparative Example a and the exemplary embodiment b of the present invention.
Figure 25B:
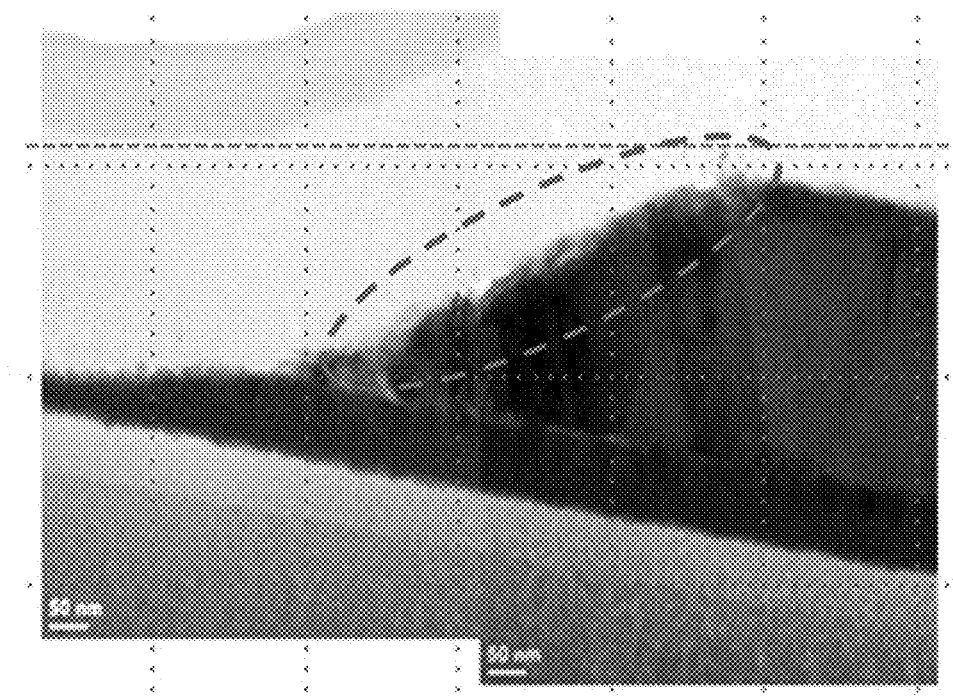

Next, a result of an experiment about oxidization of the data conductors of the thin film transistor array panel according to an exemplary embodiment of the present invention and a thin film transistor array panel according to the Comparative Example with reference to FIGS. 25A and 25B.

FIGS. 25A and 25B are photographs of main wire layers of the thin film transistor array panels according to the Comparative Example a and the exemplary embodiment b of the present invention.

In the Comparative Example, contrary to the exemplary embodiment of the present invention, the thin film transistor array panel is manufactured without the capping layer, and in the exemplary embodiment of the present invention, the thin film transistor array panel including the capping layer is manufactured.

As illustrated in FIG. 25A, it can be seen that in the thin film transistor array panel that does not include the capping layer, a lateral part of the wire is oxidized and raised. In contrast, as illustrated in FIG. 25B, it can be seen that in the thin film transistor array panel including the capping layer, all of the upper surfaces and the lateral surface of the wire are not oxidized.

As described above, the thin film transistor array panel according to an exemplary embodiment of the present invention has an advantage in that it is possible to prevent the surface of the main wire layer from being oxidized by forming the capping layer interposed between the main wire layer and the passivation layer of the thin film transistor array panel, and prevent even the lateral surface of the main wire layer from being oxidized by forming the capping layer even on the lateral surface of the main wire layer, as well as the upper surface of the main wire layer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array panel, comprising:
a gate line disposed on a first insulating substrate, the gate line comprising a gate electrode;
a semiconductor layer disposed on the gate electrode;
a data conductor layer disposed on the semiconductor layer, the data conductor layer comprising a data line crossing the gate line, a source electrode connected to the data line, and a drain electrode facing the source electrode;
a capping layer directly contacting the data conductor layer and directly contacting a lateral side surface of the semiconductor layer; and
a first passivation layer disposed on the capping layer, wherein:
the capping layer and the semiconductor layer comprise the same material.

2. The thin film transistor array panel of claim 1, wherein the data conductor layer comprises copper or a copper alloy.

3. The thin film transistor array panel of claim 2, wherein the capping layer comprises one or more selected from amorphous silicon, an oxide semiconductor, and a low temperature polysilicon (LTPS).

4. The thin film transistor array panel of claim 3, wherein the semiconductor layer and the capping layer comprise at least one of zinc (Zn), indium (In), tin (Sn), gallium (Ga), and hafnium (Hf).

5. The thin film transistor array panel of claim 3, wherein:
the semiconductor layer has a thickness in a range of 300 to 600 Å;
the capping layer has a thickness less than that of the semiconductor layer; and
the capping layer has a thickness in a range of 100 to 500 Å.

6. The thin film transistor array panel of claim 2, further comprising an etch stopper disposed between the source electrode and the drain electrode, and disposed on the exposed semiconductor layer.

7. A liquid crystal display, comprising:
a first insulating substrate;
a second insulating substrate facing the first insulating substrate;
a gate line disposed on the first insulating substrate, the gate line comprising a gate electrode and a gate pad part;
a semiconductor layer disposed on the gate electrode;
a data conductor layer disposed on the semiconductor layer, the data conductor layer comprising a data line crossing the gate line, a source electrode connected to the data line and exposing at least a part of the semiconductor layer, a drain electrode facing the source electrode, and a data pad part;
a capping layer directly contacting the data conductor layer and directly contacting a lateral side surface of the semiconductor layer;
a first passivation layer and a second passivation layer disposed on the capping layer;
a pixel electrode and a common electrode disposed on the second passivation layer, the pixel electrode and the common electrode overlapping with a third passivation layer interposed therebetween;

a light blocking member and a color filter disposed on the second insulating substrate; and a liquid crystal layer interposed between the first insulating substrate and the second insulating substrate, wherein:

the capping layer and the semiconductor layer comprise the same material.

8. The liquid crystal display of claim 7, wherein:

the data conductor layer comprises copper or a copper alloy; and the capping layer comprises one or more selected from amorphous silicon, an oxide semiconductor, and a low temperature polysilicon (LTPS).

9. The liquid crystal display of claim 8, wherein the semiconductor layer and the capping layer comprise at least one of zinc (Zn), indium (In), tin (Sn), gallium (Ga), and hafnium (Hf).

10. The liquid crystal display of claim 8, further comprising an etch stopper disposed between the source electrode and the drain electrode, and formed on the exposed semiconductor layer.

\* \* \* \* \*